United States Patent [19]
Hayafuji

[11] Patent Number: 5,315,133
[45] Date of Patent: May 24, 1994

[54] COMPOUND SEMICONDUCTOR STRUCTURE INCLUDING P-TYPE AND N-TYPE REGIONS DOPED WITH CARBON

[75] Inventor: Norio Hayafuji, Itami, Japan

[73] Assignee: Mitsubishi Denki Kabushiki Kaisha, Tokyo, Japan

[21] Appl. No.: 928,746

[22] Filed: Aug. 13, 1992

[30] Foreign Application Priority Data

Jan. 30, 1992 [JP] Japan .................................. 4-46253

[51] Int. Cl.$^5$ .................................. H01L 33/00
[52] U.S. Cl. .................................. 257/102; 257/609; 257/657
[58] Field of Search .................. 257/609, 657, 102

[56] References Cited

U.S. PATENT DOCUMENTS

| | | | |
|---|---|---|---|
| 3,617,820 | 11/1971 | Herzog | 257/86 |
| 4,845,049 | 7/1989 | Sunakawa | 437/81 |
| 5,168,077 | 12/1992 | Ashizawa et al. | 437/107 |
| 5,173,445 | 12/1992 | Ando et al. | 437/81 |

FOREIGN PATENT DOCUMENTS

| | | |
|---|---|---|
| 60-167417 | 8/1985 | Japan . |
| 63-143810 | 6/1988 | Japan . |
| 2203520 | 8/1990 | Japan . |
| 34517 | 1/1991 | Japan . |

OTHER PUBLICATIONS

Guido et al, "Carbon-doped $Al_xGa_{1-x}As$-GaAs quantum well lasers", Applied Physics Letters 52, Feb. 15, 1988, pp. 522-524.

Cunningham et al, "Carbon tetrachloride doped $Al_x$-$Ga_{1-x}As$ grown by metalorganic chemical vapor deposition", Applied Physics Letters 56, Feb. 26, 1990, pp. 36-38.

Cunningham et al, "Carbon-doped base GaAs/AlGaAs heterojunction bipolar transistor grown by metalorganic chemical vapor deposition tetrachloride as a dopant source", Applied Physics Letters 56, Jan. 22, 1990, pp. 361-363.

Tischler et al, "Acceptor doping of (Al,Ga)As using carbon by metalorganic vapor phase epitaxy", Journal of Crystal Growth 107 Jan. 1991, pp. 268-273.

"An 825nm Inverted-Inner-Strop Laser Diode With A P-GaAs Buffer Layer Grown By MOCVD", Mitsubishi Denki Giho, vol. 62, No. 11, 1981, pp. 28-31.

Nakatsuka et al, "A New Self-Aligned Structure For (GaAl) As High Power Lasers With Selectively Grown Light Absorbing GaAs Layers Fabricated by MOCVD", Japanese Journal of Applied Physics, vol. 25, No. 6, 1986, pp. L498-L500.

Primary Examiner—Robert Limanek
Attorney, Agent, or Firm—Leydig Voit & Mayer

[57] ABSTRACT

While depositing a III-V compound semiconductor layer from a vapor, carbon is added to group III and V elements to produce a p type conductivity region in the depositing semiconductor layer. Then, a small amount of n type dopant is added to the group III and V elements together with the carbon to produce an n type conductivity region in the depositing semiconductor layer. A sharp and precisely controlled doping profile is produced in the vicinity of a p-n junction, resulting in a semiconductor device having good initial performance and high reliability.

3 Claims, 5 Drawing Sheets

COMPOUND SEMICONDUCTOR STRUCTURE INCLUDING P-TYPE AND N-TYPE REGIONS DOPED WITH CARBON

FIELD OF THE INVENTION

The present invention relates to a III-V compound semiconductor device including a p-n junction and a method for producing the semiconductor device.

BACKGROUND OF THE INVENTION

FIG. 5 is a perspective view showing a laser diode disclosed in Mitsubishi Denki Giho Vol. 62, No. 11 (1988), pp. 28-31 as an example of a prior art III-V compound semiconductor device having a p-n junction. In FIG. 5, reference numeral 1 designates an n type GaAs substrate. An n type AlGaAs first cladding layer 2 is disposed on the substrate 1. A p type AlGaAs active layer 3 is disposed between the n type AlGaAs first cladding layer 2 and a p type AlGaAs second cladding layer 4 which have lower refractive indices than that of the active layer. The p type AlGaAs second cladding layer 4 has a stripe-shaped ridge structure. A p type GaAs buffer layer 5 and an n type GaAs current blocking layer 6 are disposed on opposite sides of the ridge structure. A p type GaAs contact layer 7 is disposed on the ridge structure and the n type GaAs current blocking layer 6. A stripe-shaped positive electrode 8 is disposed on the p type GaAs contact layer. The conductivity type of the GaAs buffer layer 5 gradually changes from n to p upwardly so that the regrowth surface of the p type AlGaAs second cladding layer 4 does not contact with the n type GaAs current blocking layer, whereby the current blocking characteristic is improved. A negative electrode 9 is disposed on the rear surface of the n type GaAs substrate 1. Selenium (Se) and zinc (Zn) are used as n type and p type dopants, respectively.

A description is given of the operation.

When plus and minus voltages are applied to the positive and negative electrodes 8 and 9, respectively, to bias the p-n junction of the p type AlGaAs active layer 3 and the n type AlGaAs first cladding layer 2 in a forward direction, high concentrations of electrons and holes are injected into the p type AlGaAs active layer 3 from the cladding layers 2 and 4. The injected carriers are confined by a barrier of a heterojunction between the n type AlGaAs first cladding layer 2 and the p type AlGaAs active layer 3 and recombine with a high efficiency in the active layer 3, generating laser light. A greater part of the laser light generated by the recombination of carriers is confined in the active layer 3 due to the difference in refractive indices between the active layer 3 and the cladding layers 2 and 4. At this time, the light emitting region is limited to the center of the active layer 3 due to the current concentrating effect of the current blocking layer 6.

FIG. 6 includes SIMS (Secondary Ion Mass Spectroscope) profiles of selenium (Se) and zinc (Zn) concentrations in the vicinity of the active layer 3. FIG. 7 includes profiles of n type and p type carrier concentrations. The laser diode shown in FIG. 5 is fabricated using an epitaxial growth method and when the AlGaAs first cladding layer 2 is grown, Se is added to a concentration of $10^{17}$ cm$^{-3}$ or more as an n type dopant. During the epitaxial growth, if attention is given to the crystal growth considering As, Se atoms fill vacancies $V_{As}$, which are originally to be filled with As atoms, and act as donors as represented by the following reaction formula (1).

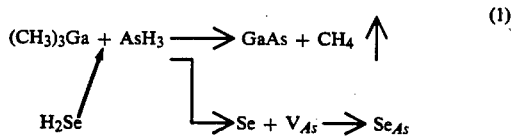

(1)

On the other hand, when the n type AlGaAs first cladding layer 2 and the p type AlGaAs active layer 3 are grown, Zn is added to a concentration of $10^{17}$cm$^{-3}$ or more as a p type dopant. At this time, if attention is given to a crystal growth concerning Ga, Zn atoms fill vacancies $V_{Ga}$, which are originally to be filled with Ga atoms, and act as a acceptors as represented by the following reaction formula (2).

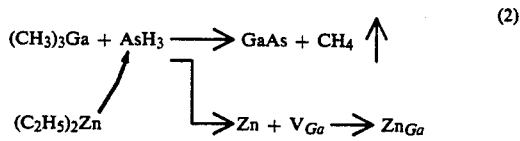

(2)

As described above, each of Se and Zn is added to a concentration as high as or higher than $10^{17}$ cm$^{-3}$ to produce the p-n junction, so that a mutual diffusion occurs at the p-n interface and the profile of the carrier concentration at the p-n interface is not sharp as shown in FIG. 7. In FIGS. 6 and 7, a.u. means an arbitrary unit.

In the above-described laser diode, the sharpness and controllability of the doping profile are poor, which reduces initial performance and reliability of a completed device.

In order to realize a sharp carrier concentration profile at the p-n interface, following methods have been proposed. In Japanese Published Patent Application No. 60-167417, the conductivity type of a semiconductor layer is controlled not by doping impurities but by changing the composition ratio of group III compound semiconductor to the group V compound semiconductor. In Japanese Published Patent Applications Nos. 2-203520 and 3-4517, a vapor phase growth is carried out using trimethylgallium as a dopant gas including a group III element and arsine as a dopant gas including a group V element. During the growth, the ratio of the concentrations of these gases is controlled to incorporate carbon atoms with Ga atoms, whereby the carbon atoms function as a p type dopant. In Japanese Published Patent Application No. 63-143810, a vapor phase growth is carried out using trimethylgallium as a dopant gas including a group III element and arsine as a dopant gas including a group V element. During the growth, a p type region is formed by incorporating carbon atoms with Ga atoms and an n type region having a desired carrier concentration is formed with As and Se, resulting in a p-n junction.

In the above-described conventional methods, however, it is necessary to change the growth conditions significantly to control the conductivity type of the semiconductor layer, such as a change in the ratio of concentrations of the dopant gases, so that the crystal growth is not favorably carried out at the p-n interface. In addition, when the growth conditions change, vacancies may remain on the growth surface of the substrate without being filled with the carbon atoms. Such imperfect crystal growth and vacancies adversely affect the characteristics of the device, resulting in a poor initial-performance and a poor reliability.

SUMMARY OF THE INVENTION

It is an object of the present invention to provide a III-V compound semiconductor device that has a sharp and precisely-controlled doping profile, favorably grown crystal line structure the p-n interface, good initial-performance, and high reliability.

It is another object of the present invention to provide a production method for such a semiconductor device.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to an aspect of the present invention, a semiconductor device includes a p type region in which group III atoms combine with carbon atoms and an n type region in which group V atoms combine with carbon atoms or n type impurities.

According to another aspect of the present invention, in a method for producing a semiconductor device, a prescribed amount of carbon gas is added to a first gas including group III atoms and a second gas including group V atoms to form a p type region. Then, a small amount of n type impurities is added to the first and second gases and the carbon gas to form an n type region. Therefore, a steep and precisely-controlled doping profile is obtained in the vicinity of a p-n interface.

BRIEF DESCRIPTION OF THE DRAWINGS

FIGS. 1(a)-1(c) are diagrams for explaining crystal growth in the vicinity of an active layer of a laser diode in accordance with a first embodiment of the present invention, in which FIG. 1(a) is a sectional view and FIGS. 1(b) and 1(c) are schematic diagrams showing atomic arrangements;

DETAILED DESCRIPTION OF THE PREFERRED EMBODIMENTS

Figure 1A:
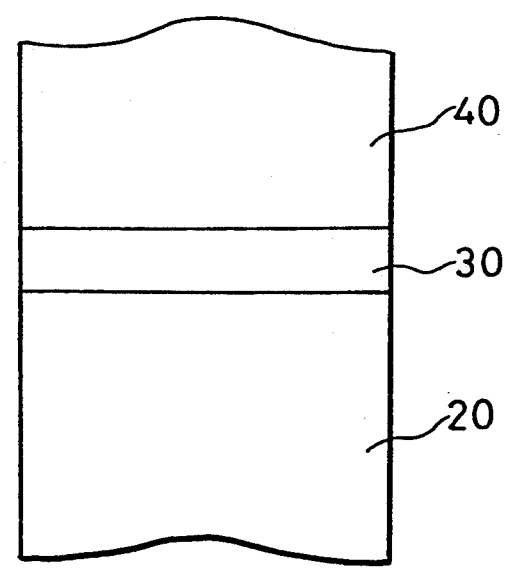
Figure 1B:
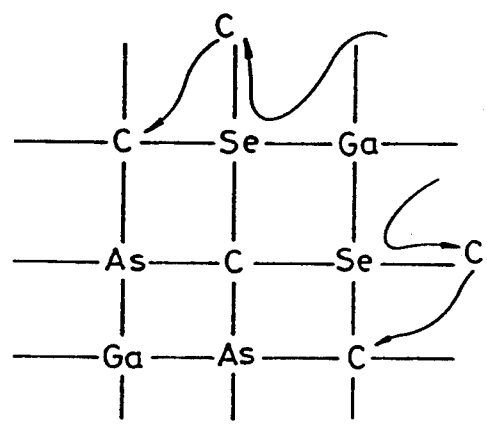
Figure 1C:
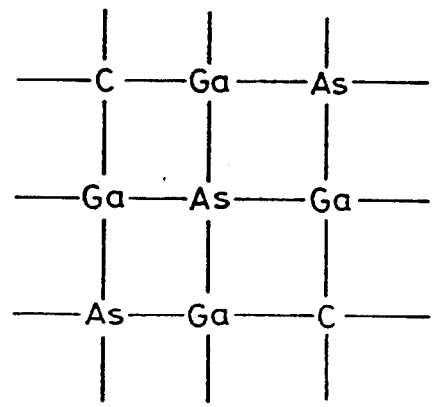
Figure 2:
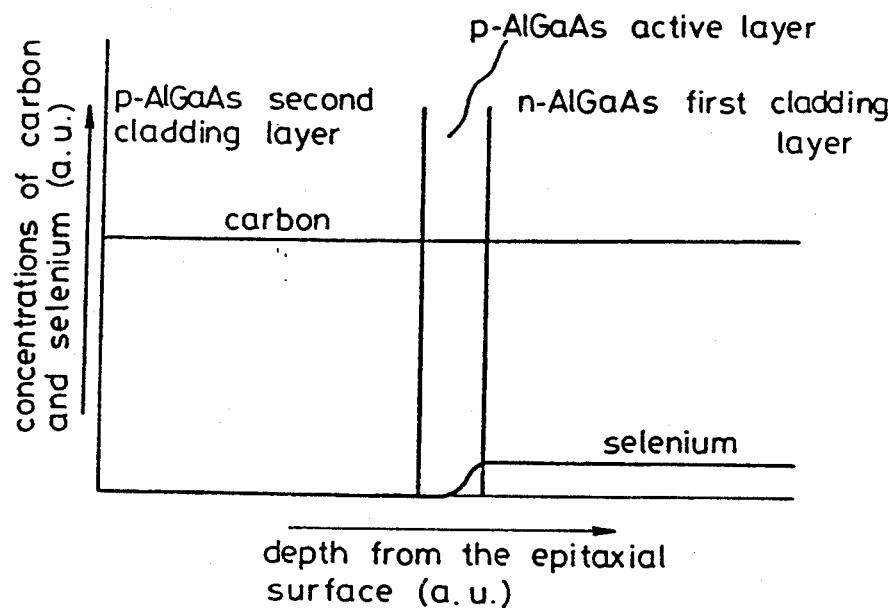
FIG. 2 is a diagram showing SIMS profiles of carbon and selenium in the structure shown in FIG. 1(a)
Figure 3:
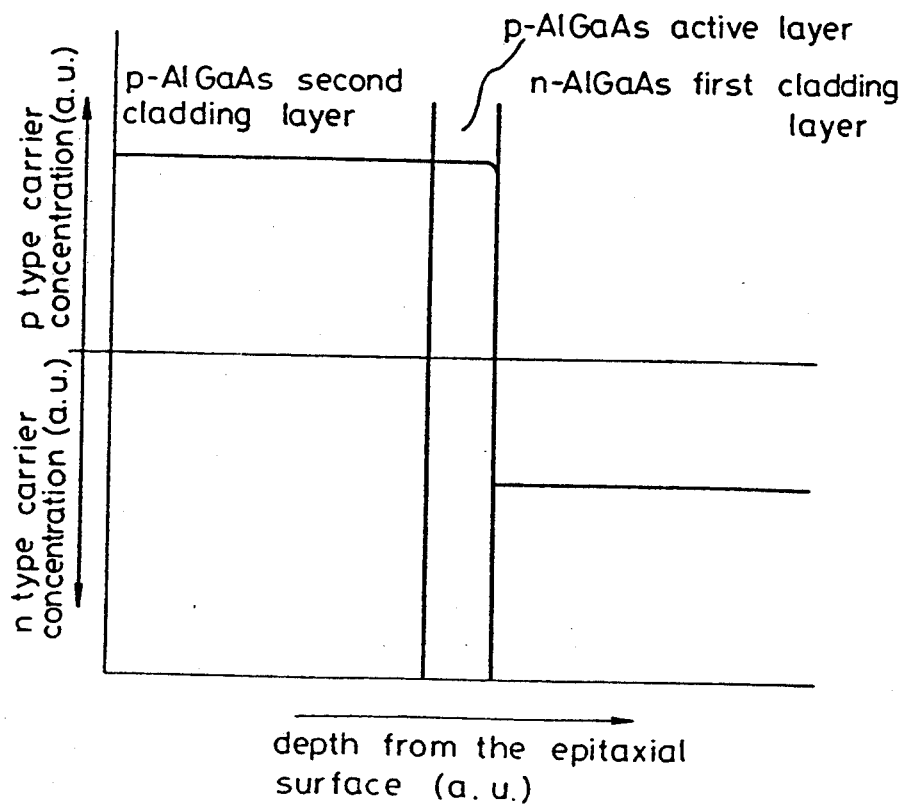
FIG. 3 is a diagram showing n type and p type carrier concentrations in the structure shown in FIG. 1(a)

FIGS. 1(a)-1(c) are diagrams for explaining crystal growth in the vicinity of an active layer of a laser diode in accordance with a first embodiment of the present invention. More specifically, FIG. 1(a) is a sectional view showing the active layer and its vicinity and FIGS. 1(b) and 1(c) are schematic diagram showing atomic arrangements in the growth process. In FIG. 1(a), a p type AlGaAs active layer 30 is disposed between an n type AlGaAs first cladding layer 20 and a p type AlGaAs second cladding layer 40. In FIGS. 1(b) and 1(c), Ga is used as group III atoms and As is used as group V atoms, and Al is omitted for simplification. FIG. 2 illustrates SIMS profiles of carbon and selenium in the structure of FIG. 1(a) and FIG. 3 shows n type and p type carrier concentrations in the structure of FIG. 1(a).

A description is given of the production method. First, the n type AlGaAs first cladding layer 20 is grown by vapor deposition. Trimethylgallium and trimethylaluminum are employed as group III atom source materials and arsine is employed as a group V atom source material. Hydrogen-diluted hydrogen selenide ($H_2Se$) gas or the like is used as a source of selenium and selenium is added to a concentration of $1 \times 10^{16}$ cm$^{-3}$. Trimethylarsenic (TMAs) gas, carbon tetrachloride ($CCl_4$) gas, or the like is employed as a source of carbon and carbon is added to a concentration of $2 \times 10^{17}$ cm$^{-3}$. The growth temperature is about 800° C. and the pressure in a reaction tube is about 100 Torr. During the growth, carbon atoms, which should originally fill group V atom vacancies and function as a p type dopant, fill group III atom vacancies and function as n type dopant because the group V atom vacancies are filled with selenium atoms as shown in FIG. 1(b). This reaction is represented by the following formula (3).

$(CH_3)_3Al +$                               (3)

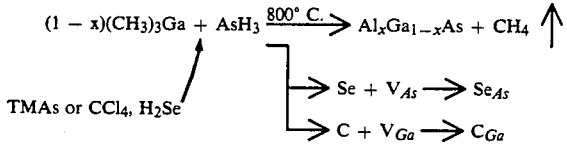

At this time, $10^{17}$ to $10^{18}$ selenium atoms per mol fill the group V atom vacancies and approximately the same number of carbon atoms fill the group III atom vacancies. In this way, the n type $Al_{0.48}Ga_{0.52}As$ first cladding layer 20 about 1.5 microns thick is formed. Although the carbon atoms are not likely to fill the group III atom vacancies usually, the presence of the selenium atoms in the group V atom vacancies causes the carbon atoms to fill the group III atom vacancies.

When the p type AlGaAs active layer 30 is grown the supply of $H_2Se$ is stopped and the supply of trimethylaluminum gas is decreased. Then, the selenium atoms are eliminated from the reaction gas, so that the carbon atoms begin to fill the group V atom vacancies as shown in FIG. 1(c) and function as a p type dopant. This reaction is represented by the following formula (4).

$(CH_3)_3Al +$                               (4)

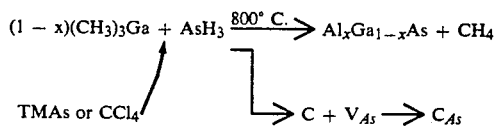

At this time, $10^{17}$ to $10^{18}$ carbon atoms per mol fill the group V atom vacancies. In this way, the p type $Al_0$..

lGa$_{0.9}$As active layer 30 approximately 300 angstroms thick is formed.

Thereafter, the supply of trimethylaluminum gas is again increased to grow the p type Al$_{0.48}$Ga$_{0.52}$As second cladding layer 40 approximately 1.5 microns thick.

As shown in FIG. 3, the carrier concentration in the vicinity of the active layer 30 has a sharp change at the boundary between the active layer 30 and the first cladding layer 20. That is, the carbon atoms, continuously supplied during the growth process, function as a p type dopant in the first cladding layer 20 and as an n type dopant in the active layer 30 and the second cladding layer 40.

Figure 4:
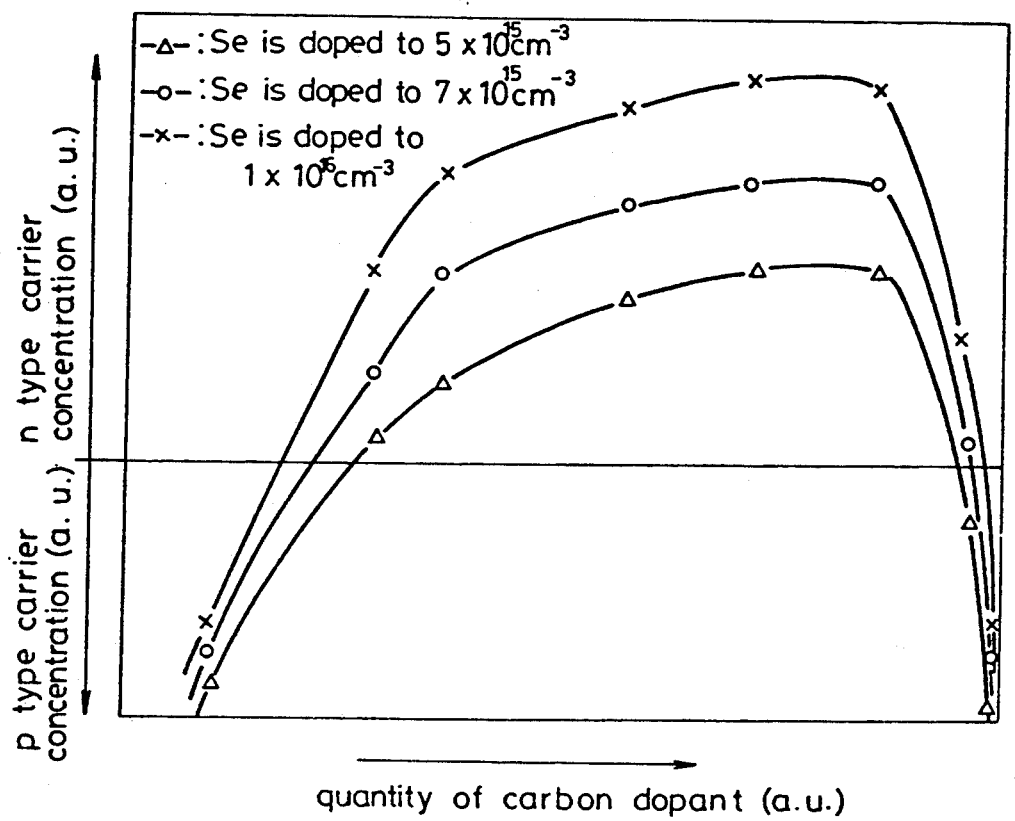
FIG. 4 is a diagram showing a relation between a quantity of carton incorporated into AlGaAs and carrier concentration in accordance with the first embodiment of the present invention.
Figure 5:
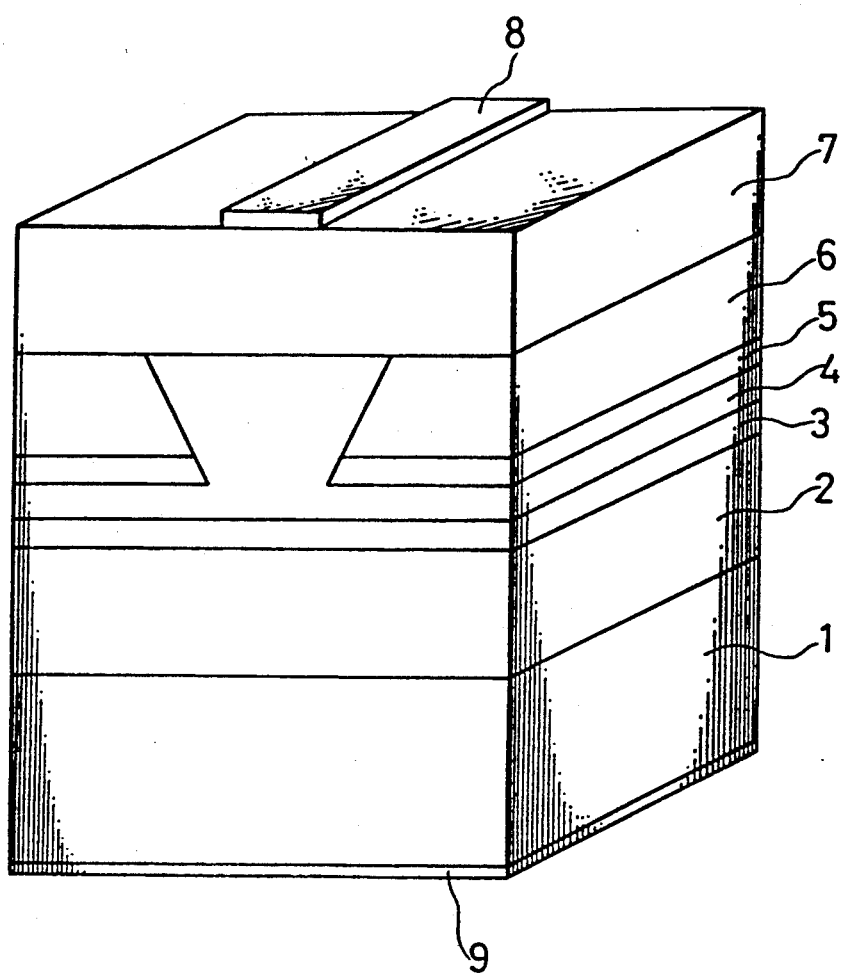
FIG. 5 is a perspective view of a laser diode in accordance with the prior art.
Figure 6:
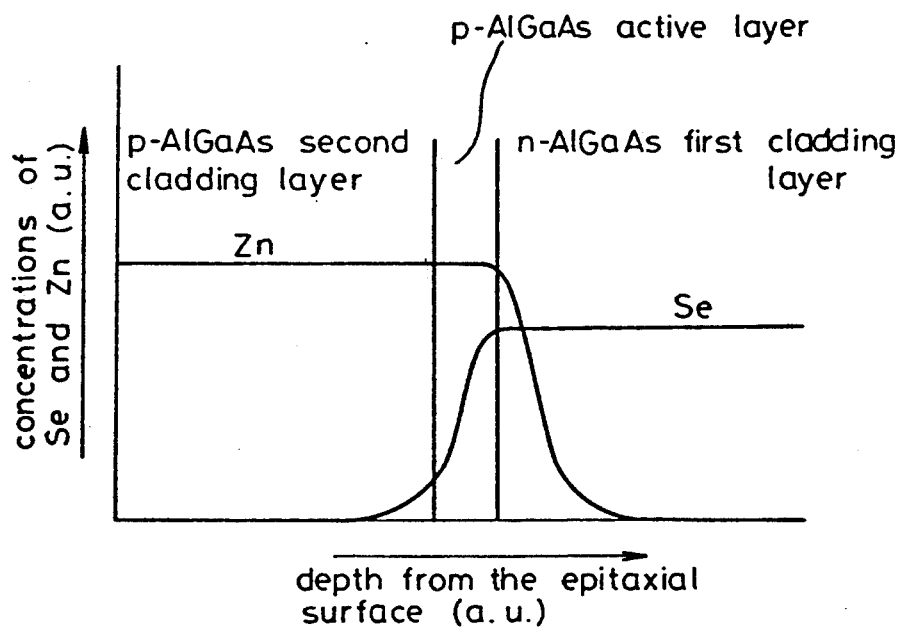
FIG. 6 is a diagram showing SIMS profiles of selenium and zinc in the vicinity of the active layer of the laser diode shown in FIG. 5.
Figure 7:
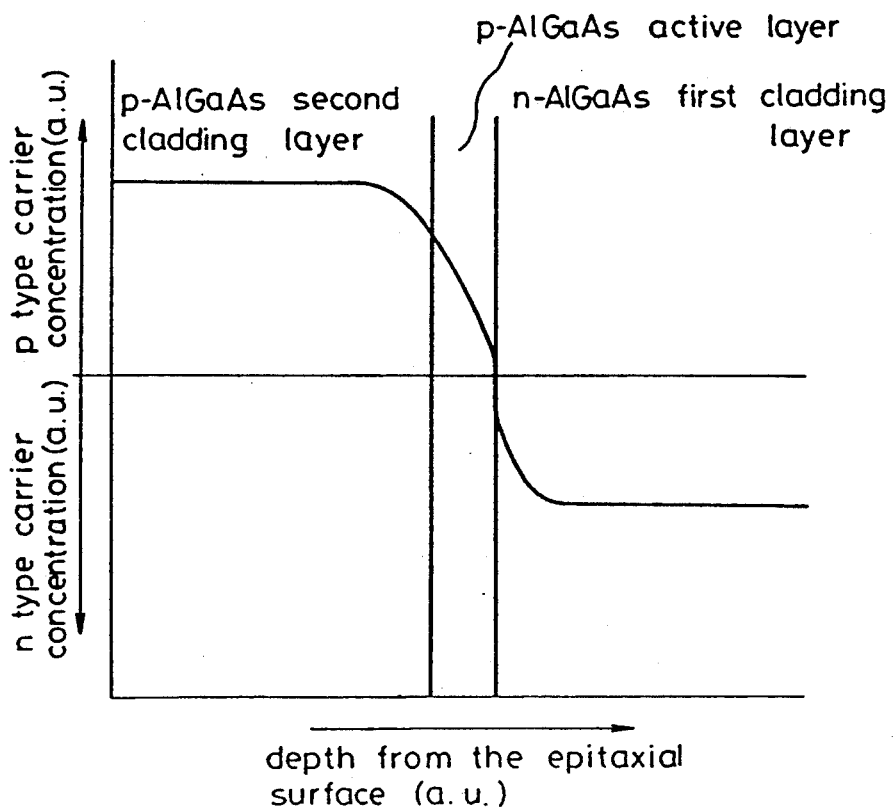
FIG. 7 is a diagram showing n type and p type carrier concentrations in the vicinity of the active layer of the laser diode shown in FIG. 5.

As shown in FIG. 4, the carrier concentration is arbitrarily changed by increasing the amount of selenium or carbon incorporated in the AlGaAs. In addition, when the amount of carbon is increased to a certain degree, the n type carrier concentration decreases and a nature of carbon as a p type dopant appears, whereby the maximum amount of carbon that can serve as an n type dopant is found.

According to the present invention, when carbon and a small amount of selenium which fills the group V atom vacancies and functions as an n type dopant are introduced into a reaction tube together with the source gases including group III and V atoms, the carbon, which functions as a p type dopant when selenium is not applied, functions as an n type dopant. Therefore, the growth conditions are not changed so much as compared with the conventional method of changing the ratio of the group III and V gases supplied to obtain a p type doping profile, so that an improved crystal growth is carried out. In addition, the control of both p type and n type conductivities is carried out by applying carbon having a small diffusion coefficient, so that mutual diffusion at the p-n interface is reduced and a very sharp and precise carrier profile is achieved as designed. In case of a laser diode, initial performance and reliability are significantly improved.

While in the above-illustrated embodiment the AlGaAs laser diode is employed as an example of a semiconductor device, the present invention may be applied to other III-V compound semiconductor devices having p-n junctions, such as a HEMT, a heterojunction bipolar transistor, or the like.

While in the above-illustrated embodiment Ga and As are employed as the group III element and the group V element, respectively, other group III and group V elements may be employed. In addition, although selenium is used as an element added to the source gases together with carbon, tellurium (Te) or sulfur (S) may be employed.

As is evident from the foregoing description, in a III-V compound semiconductor device according to the present invention, carbon is added to the source gases for producing the III-V compound semiconductor layer, so that carbon atoms fill the group V atom vacancies, thereby controlling the p type conductivity. A small amount of n type dopant is added together with the carbon, so that the carbon atoms fill the group III atom vacancies, thereby controlling the n type conductivity. Therefore, a steep doping profile is obtained in the vicinity of a p-n interface, so that a precisely-controlled heterojunction is achieved as designed, resulting in a compound semiconductor device having high good initial-performance and high reliability.

What is claimed is:

1. A III-V compound semiconductor structure including a body of gallium arsenide having an n-type region doped with a first concentration of carbon atoms and a second concentration of atoms selected from the group consisting of selenium, tellurium, and sulfur, the first concentration exceeding the second concentration, and a p-type region contacting the n-type region and doped with carbon atoms.

2. The compound semiconductor structure of claim 1 wherein the n-type region contains selenium.

3. The compound semiconductor structure of claim 2 wherein the first concentration is about $2 \times 10^{17}$ cm$^{-3}$ and the second concentration is about $10^{16}$ cm$^{-3}$.

* * * * *